(12) United States Patent
Heismann et al.

(10) Patent No.: US 8,093,535 B2
(45) Date of Patent: Jan. 10, 2012

(54) TEMPERATURE-CONTROLLED CIRCUIT INTEGRATED IN A SEMICONDUCTOR MATERIAL, AND METHOD FOR CONTROLLING THE TEMPERATURE OF A SEMICONDUCTOR MATERIAL HAVING AN INTEGRATED CIRCUIT

(75) Inventors: Björn Heismann, Erlangen (DE); Helmut Winkelmann, Eggolsheim (DE)

(73) Assignee: Siemens Aktiengesellschaft, Munich (DE)

( * ) Notice: Subject to any disclaimer, the term of this patent is extended or adjusted under 35 U.S.C. 154(b) by 1420 days.

(21) Appl. No.: 11/641,872

(22) Filed: Dec. 20, 2006

(65) Prior Publication Data
US 2007/0158575 A1    Jul. 12, 2007

(30) Foreign Application Priority Data

Dec. 21, 2005  (DE) .......................... 10 2005 061 358

(51) Int. Cl.
*H05B 1/02* (2006.01)
(52) U.S. Cl. .... 219/494; 219/497; 219/210; 250/370.15
(58) Field of Classification Search .................. 219/494, 219/497, 501, 505, 209, 210; 250/370.15; 257/462
See application file for complete search history.

(56) References Cited

U.S. PATENT DOCUMENTS

| 5,517,053 | A | 5/1996 | Dietz et al. |
| 6,184,504 | B1 * | 2/2001 | Cardella ........................ 219/513 |
| 6,525,550 | B2 * | 2/2003 | Pan ................................ 324/721 |
| 6,815,643 | B2 | 11/2004 | Der Ropp |
| 6,925,142 | B2 | 8/2005 | Pohan et al. |
| 2003/0168605 | A1 | 9/2003 | Chambaud et al. |

FOREIGN PATENT DOCUMENTS

| DE | 196 15 178 A1 | 10/1997 |
| DE | 100 34 262 C1 | 9/2001 |
| DE | 101 38 913 A1 | 3/2003 |
| WO | WO 95/30200 A1 | 11/1995 |

* cited by examiner

*Primary Examiner* — Mark Paschall
(74) *Attorney, Agent, or Firm* — Harness, Dickey & Pierce, P.L.C.

(57) ABSTRACT

A circuit is disclosed, integrated in a semiconductor material, for measuring signals of a sensor assigned to the integrated circuit. In at least one embodiment, the circuit includes an active component; a temperature sensor; and a circuit to control the temperature of the semiconductor material. The active component is provided to treat the measuring signals produced by the sensor and the active component is drivable by the circuit to control the temperature in such a way that the temperature of the semiconductor material is variable. Further, the circuit includes at least one of a PI and PID controller to control the temperature. A method for controlling the temperature of a semiconductor material that has an integrated circuit is further disclosed.

14 Claims, 2 Drawing Sheets

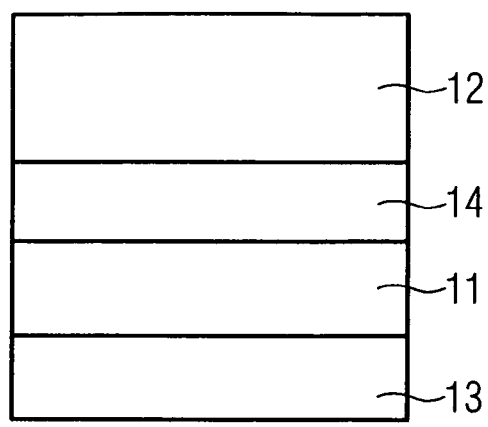
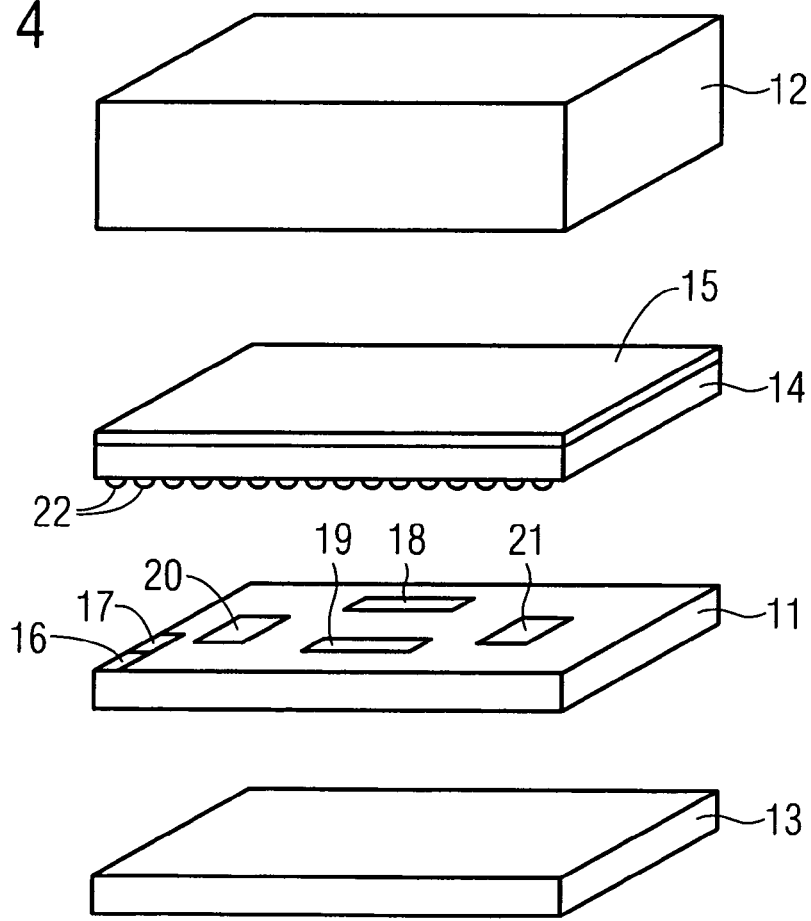

TEMPERATURE-CONTROLLED CIRCUIT INTEGRATED IN A SEMICONDUCTOR MATERIAL, AND METHOD FOR CONTROLLING THE TEMPERATURE OF A SEMICONDUCTOR MATERIAL HAVING AN INTEGRATED CIRCUIT

PRIORITY STATEMENT

The present application hereby claims priority under 35 U.S.C. §119 on German patent application number DE 10 2005 061 358.6 filed Dec. 21, 2005, the entire contents of which is hereby incorporated herein by reference.

FIELD

Embodiments of the invention relate to a circuit integrated in a semiconductor material, for example for measuring signals of a sensor assigned to the integrated circuit. The integrated circuit may include at least one active component, for example for treating the measuring signals produced by the sensor. Embodiments of the invention furthermore generally relate to a method for controlling the temperature of a semiconductor material having an integrated circuit.

BACKGROUND

In many fields of technology, use is made of circuits integrated in a semiconductor material for the purpose of reading out and processing measuring signals that originate from a sensor assigned to the integrated circuit. Such combinations of sensors and integrated circuits are to be found, for example, in X-ray detectors of X-ray computed tomography units. The X-ray detectors are generally constructed from a multiplicity of juxtaposed detector modules of which each comprises a sensor for X-radiation and an integrated circuit connected to the sensor.

Components of the integrated circuit, such as capacitors, resistors, transistors or, inter alia, comparators or integrators constructed from transistors, in this case exhibit an operating behavior dependent on temperature, and this has an effect on the processing of the measuring signals obtained with the sensor. The stability of offset signals or the quality of the linearity of a circuit component may be named by way of example.

Again, the measurement response of the sensors for x-radiation is itself influenced by the temperature. If, for example, semiconductor-based photodiodes are used in the sensor, a doubling of the dark current of the photodiodes can be observed in each case in the event of an increase in the temperature of the semiconductor material from 5 to 9 kelvins. Thus, since the measuring accuracy of a detector module, in particular of its sensor for X-radiation and of its integrated circuit, depends on the temperature in a way that cannot be neglected, measures are taken in order at least to keep the sensor and the integrated circuit of a detector module substantially at a constant temperature.

Thus, US 2003/0168605 A1 discloses a radiation detector that has a device with the aid of which the radiation detector can be kept substantially at a constant temperature. The actual temperature of a semiconductor component of the detector is compared with the setpoint temperature via a comparator. In the event of a deviation from the setpoint temperature, heating resistors are supplied with current in order to heat the detector up to the setpoint temperature.

DE 196 15 178 C2 describes a device for digital radiography with a sensor device which includes a semiconductor sensor array, to which a scintillator layer is applied, that has a temperature control device for keeping the sensor device at a constant temperature. The sensor is preferably designed as a CCD sensor and provided on its rear side with a heating element, it being possible to keep the temperature of the sensor constant by active control.

DE 100 34 262 C1 discloses a circuit integrated in a semiconductor material and having an active component, a temperature sensor and a circuit. If the temperature measured by the temperature sensor undershoots a temperature limit value, the circuit causes a heat generating process. In this case, either dummy operating cycles of the circuit are initiated, or an oscillator which is provided separately is operated.

U.S. Pat. No. 5,517,052 A discloses a circuit that is integrated in a semiconductor material and has an active component, a temperature sensor and a circuit for controlling the temperature of the semiconductor material. The active component is "oscillating transistors". The transistors use various heating elements in order to control the temperature.

WO 95/30200 A1 discloses a circuit integrated in a semiconductor material and having an active component that is a computer CPU. In order to control the CPU temperature acquired by a temperature sensor, a circuit is provided that varies the CPU clock rate in accordance with the acquired temperature, the generation of heat, and thus the CPU temperature, being influenced thereby.

DE 101 38 913 A1 relates to a detector module for an X-ray computer tomograph. A circuit that is not integrated in a semiconductor material is provided for measuring signals of a sensor assigned to the circuit. A separate heating element is provided for controlling the temperature of the semiconductor material.

SUMMARY

In at least one embodiment of the present invention, a circuit integrated in a semiconductor material is specified, along with a method for the latter. In at least one embodiment, this is done in such a way that it is possible in a simple way for the semiconductor material having the integrated circuit to be brought to a specific temperature and/or to be held at a substantially constant temperature.

According to at least one embodiment of the invention, a circuit integrated in a semiconductor material is provided for measuring signals of a sensor assigned to the integrated circuit. The circuit has an active component, a temperature sensor and a circuit for controlling the temperature of the semiconductor material. The active component is provided for treating the measuring signals produced by the sensor, and can, in addition, be driven by the circuit for controlling the temperature in such a way that the temperature of the semiconductor material is variable in a targeted fashion, the circuit having a PI or PID controller for controlling the temperature.

A circuit integrated in a semiconductor material has at least one active component, at least one temperature sensor and at least one circuit for controlling the temperature of the semiconductor material, it being possible for the circuit for controlling the temperature to influence the operation of the active component in such a way that the temperature of the semiconductor material is variable in a targeted fashion. On the basis of a preferably continuous measurement of the temperature of the semiconductor material with the aid of the temperature sensor, the circuit for controlling the temperature can control the operation of the active component of the integrated circuit in such a way that the temperature of the semiconductor material is variable because of the heat loss occurring during the operation of the active component.

The temperature of the semiconductor material is preferably controlled to a specific, prescribed setpoint temperature. To this end, the circuit for controlling the temperature has suitable circuit components that are part of a control circuit with a controller which is a PI or PID controller. Thus, according to at least one embodiment of the invention an active component of the integrated circuit, which is understood as a circuit component of the integrated circuit whose operation can be actively controlled, is used to control the temperature of the semiconductor material.

The circuit integrated in the semiconductor material is provided for measuring signals of a sensor assigned to the integrated circuit. The at least one active component is provided for treating, that is to say for reading out, preprocessing and/or passing on, the measuring signals produced by the sensor, and can, in addition, be driven by the circuit for controlling the temperature of the semiconductor material in such a way that the temperature of the semiconductor material is variable. It is possible to dispense with provision of an independent, separately designed heating device for regulating the temperature of the semiconductor material.

Instead of this, an active component of the integrated circuit present in any case for treating measuring signals is operated in such a way that the temperature can be regulated via the heat loss of the active component. Thus, the active component of the circuit for controlling the temperature is driven as a function of the signals measured with the temperature sensor in such a way that a substantially constant temperature can preferably be set over the entire semiconductor material. Should the operation of one active component of the integrated circuit not suffice for stabilizing the semiconductor material to a constant temperature, it is also possible for a number of active components to be driven in an appropriate way by the circuit for controlling the temperature.

The active component of the integrated circuit can be a shift register and/or an A/D converter. As a rule, an adequate heat loss that can be used to control the temperature occurs during its operation.

The temperature can be controlled in such a way that at times when no measuring signals are being treated by the integrated circuit, the active component is operated in such a way that the semiconductor material of the integrated circuit essentially is kept at a constant temperature. It can, for example, be provided that the semiconductor material substantially has a constant temperature of approximately 40° C. or a constant temperature that is between 20° C. to 40° C. above the ambient temperature of the semiconductor material.

The operation of the active component can in this case be a type of dummy operation in which, for example, a shift register or an A/D converter is operated without making further use of the results of the operation. During measuring operation of the integrated circuit, the semiconductor material can also certainly have temperatures that lie slightly above the setpoint temperature. It is then possible by controlling the temperature to prevent the temperature of the semiconductor material from falling below a prescribed setpoint temperature when the integrated circuit is subsequently in standby mode, that is to say when no measurement is taking place. The setpoint temperature of the semiconductor material should in this case preferably lie below the continuous temperature such that the semiconductor material is exposed only to slight temperature fluctuations and, consequently, the loads owing to large temperature fluctuations are reduced for the semiconductor material, something which exerts a positive influence on the service life or operating period.

It can be provided that the setpoint can be set, that is to say prescribed, for controlling the temperature. In this case, the setpoint can be adapted to the ambient conditions for the integrated circuit. The ambient conditions, in particular the ambient temperature, can in this case be determined with the aid of a separately-designed measuring device and be used to prescribe the setpoint temperature.

The semiconductor material can have silicon, and the integrated circuit can be designed as an ASIC. With such a design of the integrated circuit, it is possible to ensure that the outlay on integration for the temperature sensor and the circuit for controlling the temperature in the semiconductor material is relatively slight. The production of the ASIC can be realized in practice without a large increase in costs.

The integrated circuit can be assigned a light-detecting sensor array as sensor, in which the light-detecting sensor array is connected to the integrated circuit electrically and to the semiconductor material of the integrated circuit in a thermally conducting fashion. As a rule, the connection is a metallic soldered joint. It is possible in this way not only to control the temperature of the semiconductor material of the integrated circuit, but advantageously also—via the thermally conducting connection of the semiconductor material to the light-detecting sensor array—to control the temperature of the light-detecting sensor array.

This is particularly advantageous when the light-detecting sensor array is designed in the form of a semiconductor-based array of photodiodes. In this case, it is also possible for the semiconductor material of the array of photodiodes to be kept at the setpoint temperature such that it is possible at least to reduce influences on the measuring accuracy on the part of the temperature for the array of photodiodes as well.

If the aim is to use the integrated circuit and the light-detecting sensor array to detect X-radiation, the light-detecting sensor array can be assigned an array of scintillator elements that converts X-radiation into light. Finally, the photodiodes convert the light into electric signals that the integrated circuit reads out, preprocesses and/or passes on.

However, it is also possible to assign to the integrated circuit a sensor array directly converting X-radiation as sensor, the sensor array directly converting X-radiation being connected to the integrated circuit electrically and to the semiconductor material of the integrated circuit in a thermally conducting fashion. As a rule, the electrical and thermally conducting connections are also designed here as metallic soldered joints. The sensor array directly converting X-radiation is preferably a semiconductor-based sensor array. CdTe, CdZnTe, CdSeTe or comparably suitable materials which can, in addition, be doped, are suitable semiconductor materials for this. In this case, as well, the temperature of the semiconductor material of the sensor array directly converting X-radiation can be controlled by controlling the temperature of the semiconductor material of the integrated circuit as a consequence of the thermally conducting connection to the sensor array directly converting X-radiation.

BRIEF DESCRIPTION OF THE DRAWINGS

Example embodiments of the invention are described in more detail below with the aid of the attached schematics, in which:

FIG. 3 shows an alternative embodiment of a detector module of the computed tomography unit from FIG. 1, and FIG. 4 shows an exploded illustration of the detector module from FIG. 3.

DETAILED DESCRIPTION OF THE EXAMPLE EMBODIMENTS

Figure 1:
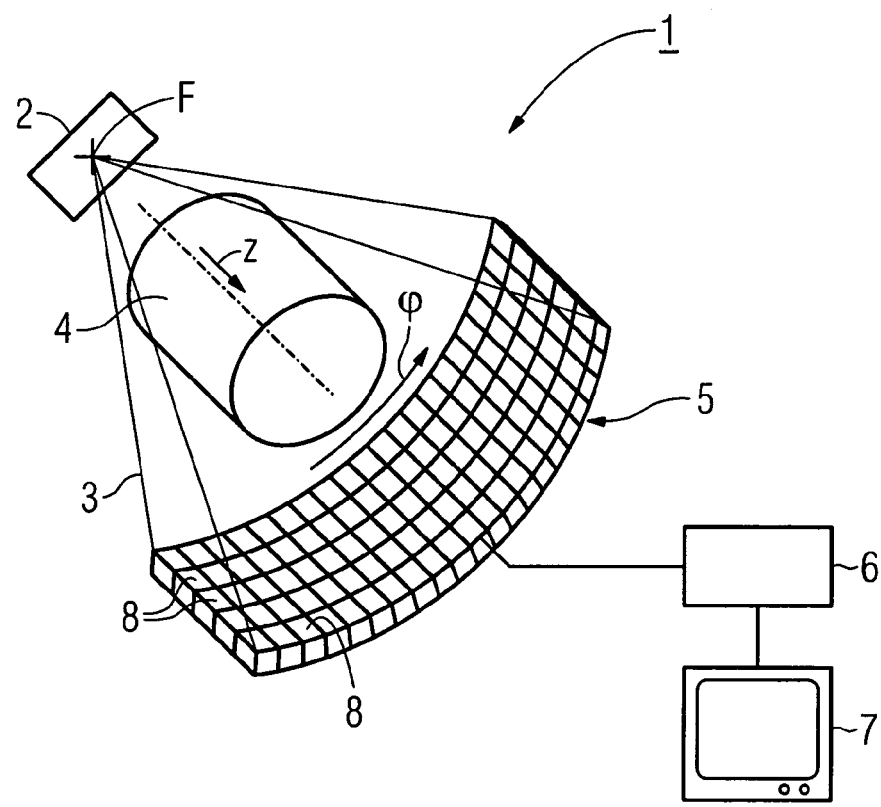
FIG. 1 is a schematic, partially of the type of a block diagram, of a computed tomography unit.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing example embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

Referencing the drawings, wherein like reference numerals designate identical or corresponding parts throughout the several views, example embodiments of the present patent application are hereafter described.

FIG. 1 is a schematic, partially of the type of a block diagram, of a computed tomography unit 1. The computed tomography unit 1 includes an X-ray source 2 from whose focus F there emanates an X-ray beam 3 that is formed in the shape of a fan or a pyramid, for example, with the aid of diaphragm plates that are not illustrated in FIG. 1 but are known per se. The X-ray beam 3 penetrates an object 4 to be examined and strikes an X-ray detector 5. The X-ray source 2 and the X-ray detector 5 are arranged (in a way not illustrated in FIG. 1) lying opposite one another on a rotary frame of the computed tomography unit 1, which rotary frame can be rotated in an f-direction about the system axis Z of the computed tomography unit 1.

When the computed tomography unit 1 is being operated, the X-ray source 2 arranged on the rotary frame and the X-ray detector 5 rotate about the object 4, X-ray pictures of the object 4 being obtained from different projection directions. In this case, per X-ray projection X-radiation that has passed through the object 4 and been attenuated by passage through the object 4 strikes the X-ray detector 5, the latter producing signals that correspond to the intensity of the striking X-radiation. Subsequently, an image computer 6 uses the signals determined with the aid of the X-ray detector 5 to calculate, in a manner known per se, one or more two- or three-dimensional images of the object 4 that can be displayed on a monitor 7.

In the case of the present example embodiment, the X-ray detector 5 has a multiplicity of detector modules 8 that are arranged next to one another in an f-direction and in a Z-direction on a detector arc (not illustrated in more detail) attached to the rotary frame, and form the planar X-ray detector 5 in the case of the present example embodiment.

Figure 2:
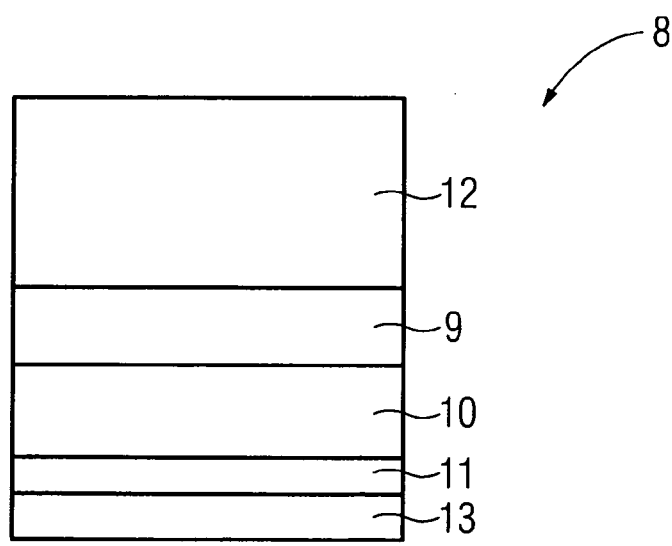
FIG. 2 shows a detector module of the computed tomography unit from FIG. 1.

An embodiment of a detector module 8 of the X-ray detector 5 is shown by way of example in FIG. 2. The detector module 8 has a vertical structure, an array of scintillator elements 9 being arranged above a light-detecting sensor array 10. In the case of the present exemplary embodiment, the light-detecting sensor array is an array of semiconductor-based photodiodes 10. The array of scintillator elements 9 and the array of photodiodes 10 are bonded to one another and in this case form the sensor for X-radiation of the detector module 8. Present above the array of scintillator elements 9 is a collimator 12 such that only X-radiation from a specific spatial direction can reach the array of scintillator elements 9.

In the case of the present example embodiment, the array of photodiodes 10 is electrically connected, via so-called bump-bond connections, which can be metallic soldered joints, with a circuit 11 integrated in a semiconductor material, and is also connected in a thermally conducting fashion to the semiconductor material of the integrated circuit 11 via the soldered joints. In the case of the present exemplary embodiment, the circuit 11 integrated in the semiconductor material is arranged on a substrate or on a printed circuit board 13 that enables an electrical contact to be made with the integrated circuit 11.

FIG. 3 shows an alternative embodiment of a detector module 8 of the X-ray detector 5 that differs from the embodiment shown in FIG. 2 only in that the light-detecting sensor array 10 and the array of scintillator elements 9 are replaced by an array of sensor elements 14 that can convert X-radiation directly into electric signals. Identical components of the two embodiments of the detector modules 8 are therefore provided with the same reference numerals.

The array of sensor elements 14 that directly converts X-radiation is based on a semiconductor material, for example CdTe, CdZnTe, CdSeTe or a comparably suitable semiconductor material, for directly converting X-radiation into electric signals. On its side facing the collimator 12, the semiconductor material has a continuous electrode 15, and on its side facing the integrated circuit 11 it has a so-called pixelated electrode (not visible in the figures) which is to be understood as a multiplicity of individual electrodes by which the array of sensor elements is structured.

As previously described, the sensor array 14 directly converting X-radiation is also connected electrically via soldered joints to the circuit 11 integrated in a semiconductor material, and is also connected in a thermally conducting fashion to the semiconductor material of the integrated circuit 11 via soldered joints. The integrated circuit 11 can, in turn, be arranged on a substrate or a printed circuit board 13 in order to be able to make electrical contact with the integrated circuit 11.

When the X-ray detector 5 that is constructed from the detector modules 8 and arranged on the rotary frame, that is to say the rotating part of the gantry, of the computed tomography unit 1 is being operated, during this operation of the X-ray detector 5, which includes measuring phases and standby phases, the X-ray detector 5 as a whole and, in particular, the semiconductor material of the integrated circuit as well as all the above-described arrays are heated and cooled.

As already mentioned at the beginning, the measuring properties of measuring devices are worsened by thermal influences, in particular where these are temperature fluctuations. For this reason, measures are taken specifically for the X-ray detector 5 in order to be able to keep the latter substantially at a constant temperature. For example, ventilators are assigned to the X-ray detector 5 in a way not illustrated in the figures. However, as a result solely of ventilating the X-ray detector 5 it is not possible for the latter to be kept at a substantially constant temperature. In particular, the ventilators cannot prevent the X-ray detector 5 from cooling whenever it is not being used for measurement and so very large temperature fluctuations can result at the detector modules 8 depending on whether they are currently being used for measurement or are in standby mode.

It is therefore proposed to measure and control the temperature inside the detector modules 8 of the X-ray detector 5.

In particular, the temperatures of the semiconductor material of the integrated circuits 11 are measured, as are also, preferably, the temperatures of the arrays of sensor elements used to detect X-radiation. In order to prevent the occurrence, between measurements with the X-ray detector 5 and standby modes of the X-ray detector 5, of intolerable temperature fluctuations at the measuring components, reacting sensitively to the temperature changes, of the measuring chain of the detector modules 8, these are heated to keep them at an at least substantially constant temperature. In order not to have to provide additional heating elements to this end, it is proposed to control the temperature by using at least one active component that is present in any case in the integrated circuit 11.

A principle aspect of at least one embodiment of the invention is explained with the aid of FIG. 4, the latter being an exploded illustration of the detector module 8 shown in FIG. 3. The functional principle is capable in this case of being transferred to the detector module 8 shown in FIG. 2 without a problem. The circuit 11 that is integrated in a semiconductor material (preferably silicon) that is, moreover, implemented as an ASIC 11 in the case of the present example embodiment, has at least one active component for treating measuring signals obtained with sensor elements of the sensor array 14 directly converting X-radiation. Here, an active component is understood as a component of the integrated circuit whose operation can be actively controlled, that is to say whose operation can thus be actively influenced. An active unit is understood, in particular, as a unit having at least one transistor. The integrated circuit, that is to say the ASIC 11, is supplemented by at least one temperature sensor and a circuit for controlling the temperature of the semiconductor material, which are likewise integrated in the semiconductor material.

In the case of the present example embodiment, the ASIC 11 has a temperature sensor 16 and a circuit 17, interacting with the temperature sensor 16, for controlling the temperature. With the aid of the temperature sensor 16 and the circuit 17 for controlling the temperature, in the case of the present example embodiment the actual temperature of the semiconductor material of the ASIC 11 is measured continuously and compared with a prescribed setpoint of the temperature. If the actual value of the temperature deviates from the setpoint of the temperature, the circuit 17 for controlling the temperature drives at least one active component of the ASIC 11 in such a way that by being operated said ASIC component produces a certain heat loss by means of which the actual temperature of the semiconductor material is raised or lowered.

The operation of the active component is preferably controlled in such a way that the semiconductor material of the ASIC 11 is kept at a substantially constant temperature. In the case of the present example embodiment, FIG. 4 indicates schematically four active components of the ASIC 11 which are two shift registers 18, 19 and two A/D converters 20, 21 of the ASIC 11. The circuit 17 for controlling the temperature is connected (in a way not illustrated in FIG. 4) to the shift registers 18, 19 and the A/D converters 20, 21 such that the circuit 17 for controlling the temperature can optionally influence the operation of only one, several or all the active components. Which, and how many, active components are activated in order to be able, with the aid of their heat loss, to keep the semiconductor material of the ASIC substantially at a constant temperature over its entire extent depends on whether this can be achieved with the aid of a single active component. Should it be necessary to operate a number of active components situated in different locations, in order to keep a substantially constant temperature over the entire semiconductor material of the ASIC 11, this is performed under control of the circuit 17 for controlling the temperature.

The circuit 17 for controlling the temperature can, furthermore, be implemented in a different way, that is to say control loop that, as controlled variable, has the actual temperature, and, as reference variable, the prescribable and settable setpoint temperature, can include another controller, depending on application, a PI or PID controller being preferred. The circuit 17 for controlling the temperature generally otherwise cooperates with a control (not illustrated) of the ASIC 11 in order to avoid control conflicts when accessing active components of the ASIC 11.

The active control of the temperature of the semiconductor material of the ASIC 11 is preferably performed at times when no measuring signals are being treated since at these times in particular, the temperature of the semiconductor material drops by comparison with the temperature during measurements, and thus the semiconductor material is exposed to comparatively large temperature fluctuations. Thus, the circuit 17 for controlling the temperature can be used to keep the semiconductor material at a substantially constant temperature corresponding to that during the measurement operation of the integrated circuit even in the so-called standby mode.

The temperature of the semiconductor material can, however, also be slightly raised during the measurement operation of the X-ray detector 5. In this case, the temperature fluctuations are, however, comparatively slight and thus the influences on the measurement accuracy are likewise comparatively slight. The active control of the temperature can, however, also be performed as the ASIC is operated, that is to say during measurements, there then being available for temperature control only such active components as are not currently required for reading out measuring signals or processing measuring signals.

For the rest, in a departure from what has been written above, it can be provided to implement on the ASIC 11 a second integrated circuit, designed separately from the integrated circuit for the measuring signals, for controlling the temperature that has at least one active component. The separately operating integrated circuit for controlling the temperature has the advantage in this case that the temperature control does not necessitate recourse to an active component of the integrated circuit for the measuring signals. Rather, the temperature control is performed only with one or more active components of the integrated circuit for controlling the temperature which operate as a dummy, as it were, and heat the ASIC 11 with their heat loss.

Embodiments of the present invention do not, however, permit only to keep the semiconductor material of the ASIC 11 at a substantially constant temperature. Owing to the thermally conducting soldered joints 22 between the semiconductor material of the ASIC 11 and the sensor array 14 directly converting X-radiation, said sensor array or the semiconductor material of the sensor array 14 is kept at a substantially constant temperature, since an exchange of heat takes place between the semiconductor material of the sensor array 14 and the semiconductor material of the ASIC 11.

This form of temperature control is also valid for the detector module 8 shown in FIG. 2, in which the array 10 of the semiconductor-based photodiodes is likewise connected to the semiconductor material of the ASIC 11 in a thermally conducting fashion via soldered joints.

Overall, the detector modules 8, whose sensors and integrated circuits are kept at a constant temperature are used to obtain and preprocess per projection measurement signals that are transmitted via slip-rings, for example, to the image computer 6 with the aid of which, as already mentioned, it is possible to reconstruct images.

Embodiments of the invention were described above using the example of an X-ray detector. However, embodiments of the invention are not limited to X-ray detectors. Rather, embodiments of the invention can be applied for any circuit integrated in a semiconductor material and which is provided for reading out and/or further processing measuring signals and whose semiconductor material is to be kept at a substantially constant temperature in order to at least reduce the dependency of the measuring accuracy on the temperature.

For the rest, active components other than shift registers or A/D converters are also suitable as active components whose heat loss is used to control the temperature.

Furthermore, the semiconductor material of the integrated circuit need not necessarily have silicon.

Not only sensors detecting X-rays come into consideration as sensors assigned to the integrated circuit, so too do sensors that detect only light, UV sensors, IR sensors or other types of measuring sensors or sensor arrays.

The integrated circuit also need not necessarily be designed as an ASIC.

Further, elements and/or features of different example embodiments may be combined with each other and/or substituted for each other within the scope of this disclosure and appended claims.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A circuit, integrated in a semiconductor material, for measuring signals of a sensor assigned to the integrated circuit, the integrated circuit comprising:
   an active component;
   a temperature sensor; and
   a circuit to control the temperature of the semiconductor material, the active component being provided to treat the measuring signals produced by the sensor and the active component being drivable by the circuit to control the temperature in such a way that the temperature of the semiconductor material is variable, the circuit including at least one of a PI and PID controller to control the temperature.

2. The integrated circuit as claimed in claim 1, wherein the active component is a shift register.

3. The integrated circuit as claimed in claim 1, wherein the active component is an A/D converter.

4. The integrated circuit as claimed in claim 1, wherein the circuit controls the temperature at times when no measuring signals are being treated, and wherein the active component is operated in such a way that the semiconductor material of the integrated circuit essentially has a constant temperature.

5. The integrated circuit as claimed in claim 1, wherein a set point to which the circuit controls the temperature can be set.

6. The integrated circuit as claimed in claim 1, wherein the semiconductor material includes silicon.

7. The integrated circuit as claimed in claim 1, wherein the integrated circuit is designed as an ASIC.

8. The integrated circuit as claimed in claim 1, wherein the integrated circuit is assigned a light-detecting sensor array as a sensor, and wherein the light-detecting sensor array is connected to the integrated circuit electrically and to the semiconductor material of the integrated circuit in a thermally conducting fashion.

9. The integrated circuit as claimed in claim 8, wherein the sensor array is an array of photodiodes.

10. The integrated circuit as claimed in claim 8, wherein the light-detecting sensor array is assigned an array of scintillator elements.

11. The integrated circuit as claimed in claim 1, wherein the integrated circuit is assigned a sensor array directly converting X-radiation as the sensor, and wherein the sensor array directly converting X-radiation is connected to the integrated circuit electrically and to the semiconductor material of the integrated circuit in a thermally conducting fashion.

12. The integrated circuit as claimed in claim 4, wherein the active component is an A/D converter.

13. The integrated circuit as claimed in claim 2, wherein a set point to which the circuit is configured to control the temperature can be set.

14. The integrated circuit as claimed in claim 9, wherein the light-detecting sensor array is assigned an array of scintillator elements.

* * * * *